United States Patent [19] [11] 4,433,298
Palm [45] Feb. 21, 1984

[54] CALIBRATED APPARENT SURFACE VOLTAGE MEASUREMENT APPARATUS AND METHOD

[75] Inventor: Charles S. Palm, San Antonio, Tex.

[73] Assignee: Datapoint Corporation, San Antonio, Tex.

[21] Appl. No.: 320,184

[22] Filed: Nov. 12, 1981

[51] Int. Cl.³ .............................................. G01R 29/12
[52] U.S. Cl. .................................................... 324/457
[58] Field of Search ......................... 355/3 TR, 3 CH; 250/322; 324/452, 455, 457, 464, 467, 459

[56] References Cited

U.S. PATENT DOCUMENTS 3,287,623 11/1966 Valancins .............................. 323/22
3,604,925 9/1971 Snelling ........................ 250/49.5 ZC
3,819,942 6/1974 Hastwell ............................... 250/324
3,950,680 4/1976 Michaels .......................... 317/262 A
4,077,709 3/1978 Borostyan .......................... 355/3 TR
4,234,249 11/1980 Weikel, Jr. ....................... 355/3 CH Primary Examiner—Michael J. Tokar
Attorney, Agent, or Firm—Andrew S. Viger

[57] ABSTRACT

The disclosed calibrated ASV measurement apparatus provides accurate measurements of the ASV (apparent surface voltage) on a photoconductive imaging medium using a relatively low cost, commercially available ASV probe. To obtain accurate ASV measurements, the probe sensitivity (relating probe voltgage output to sensed potential) is periodically recalibrated to compensate for changes in environmental and electrical conditions. The calibration function is implemented using a calibration target mounted directly to the housing of the probe's sensing head so as to occupy a portion of the probe's sensing field. During periodic calibration intervals, when the ASV probe is responsive only to potentials on the calibration target, known potentials are applied to the calibration target, and an indication of a change in probe sensitivity with respect to the calibration target is calculated and used to recalibrate the value for probe sensitivity used in ASV measurement. During periodic ASV measurement intervals (with the calibration target at ground potential), the ASV probe is exposed to a reference ground and to the ASV on the imaging medium to obtain a differential probe voltgage, and this differential voltage is translated using the calibrated probe sensitivity into the desired ASV measurement relative to the reference ground. For a preferred embodiment, the periodic ground reference potential is provided by a grounded seam on the surface of the electrophotographic drum, such that separate means for that purpose are not required to be provided as part of the ASV probe.

15 Claims, 9 Drawing Figures

CALIBRATED APPARENT SURFACE VOLTAGE MEASUREMENT APPARATUS AND METHOD

BACKGROUND OF THE INVENTION

The present invention relates to apparatus for measuring the apparent surface voltage on an electrostatic/electrophotographic medium, and more particularly to such apparatus incorporating calibration means to compensate for changes in temperature, relative humidity and electrical circuit performance which affect accurate apparent surface voltage measurements.

In recent years the data processing industry has used electrostatic/electrophotographic techniques, commonly used for photocopying, to provide high-speed, high-quality printers for hard-copy computer output. For example, laser printers have been developed in which the digital data corresponding to a desired computer output is used to modulate a laser beam that is scanned across an electrophotographic drum, with corresponding printed output being obtained by standard electrophotographic developing techniques. Such electrophotographic printing apparatus offer significant advantages over mechanical printers in terms of speed, print quality and reliability. Moreover, electrophotographic printing techniques offer greater flexibility in terms of font and graphics capabilities than other types of printers.

A principal design problem in adapting electrophotographic techniques to high-volume computer output printing is maintaining output print quality, in particular because many data processing applications require output printing operations that function relatively unattended. The two principal criteria for print quality are (a) print darkness (contrast), and (b) background cleanness. Electrophotographic copiers typically provide output copies that vary in print quality both in terms of print darkness and background cleanness, and users are generally tolerant of such variations. In the case of electrophotographic printers, however, users expect printed output to be of a consistently high-quality. In particular, users expect printed output to present a clean background without the smudges or streaking commonly associated with photocopies; given a clean background, users are fairly tolerant of variations in print darkness.

One of the most important parameters affecting electrophotographic print quality is the apparent surface voltage (ASV) on the electrophotographic imaging medium—for example the photoconductive surface of an electrophotographic drum. ASV is a measure of the electrical charge density on the photoconductive surface, the magnitude of which governs the optical density of the developed image (i.e., print output). In accordance with well known electrophotographic processes, the ASV on the photoconductive surface of a rotating drum is controlled using electrical corona discharge and optical exposure to provide an electrostatic image of the desired output.

To illustrate, one commercially available electrophotographic apparatus includes (a) a first positive corona that initially charges the photoconductive surface to a high positive potential, or ASV, on the order of 2,000 volts, and (b) a second negative corona that provides a negative discharge as corresponding portions of the photoconductive surface are optically exposed. As a result, ASV is reduced to a positive 400 to 500 hundred volts in optically unexposed areas, and $-60$ to $-90$ volts in exposed areas, thereby forming an electrostatic image. The positive ASV corresponds to the desired print image while negative ASV corresponds to unprinted background, so that the electrostatic image is developed by bringing negatively charged toner particles into contact with the photoconductive surface, where they adhere to the positive ASV print image for ultimate transfer to paper.

To provide quality print output, the ASV levels on respective portions of the photoconductive surface corresponding to print image and background should be within well defined ranges. Thus, for the above exemplary electrophotographic process, the ASV for the print image should be on the order of a positive 400 to 500 volts, while background ASV should be in the range of $-60$ to $-90$ volts. In particular, if background ASV is less negative than $-60$ volts, the negatively charged toner particles will not be sufficiently repelled so that some will adhere to the background image portion of the photoconductive surface, causing the smudging or streaking commonly associated with photocopies. On the other hand, if background ASV is more negative than $-90$ volts, then, in the case of the common toner/carrier particle developing technique, some of the positively charged carrier particles, along with adhering negative toner particles, will be transferred to the photoconductive surface resulting in a splotched or pitted background.

The appropriate ASV levels on a photoconductive surface are established by controlling corona discharge amplitudes and optical imaging intensities. Unfortunately, for a given corona amplitude and optical intensity, ASV is subject to time variation due to numerous uncontrollable causes such as changes in temperature, relative humidity and electrical circuit performance, as well as the hysteresis effects of pre-existing ASV. Indeed, these environmental and electrical factors are primarily responsible for the previously discussed variations in the output quality of electrophotographic processes.

The environmental and electrical conditions that affect ASV are too complicated to control directly. Thus, current approaches to eliminating or reducing their affect on output print quality focus on controlling ASV by continuously adjusting either optical image intensity or corona amplitude. That is, for the above exemplary electrophotographic process, image quality can be controlled by periodically measuring changes in ASV due to environmental and electrical factors, and then compensating for these factors by adjusting, typically, optical image intensity to maintain the background ASV in the exposed portions of the photoconductive surface within the desired range (i.e., $-60$ to $-90$ volts). While this compensation scheme would not affect the positive 400 to 500 volt ASV of the unexposed (printed image) portions of the photoconductive surface, it would insure a clean background for the printed output.

ASV measurement is typically accomplished using a capacitively coupled or ammeter-type sensing probe comprising a sensing head disposed adjacent a portion of the photoconductive surface, together with suitable probe electronics to convert sensed ASV into a probe output voltage. Accurate ASV measurements, however, are not straightforward because the same factors that affect ASV—temperature, relative humidity and electrical circuit performance—also affect probe sensitivity (i.e., the relationship between sensed ASV and probe output voltage). Typically, fairly complex electronics and/or manual calibration schemes are provided to reduce the effects of these factors on ASV measurement.

In addition, because the probe sensing head is AC coupled to the probe electronics, the output probe voltage is subject to drift/offset effects. To eliminate these effects, differential ASV readings must be taken by periodically exposing the probe to a known reference voltage (typically ground). Current methods of providing a ground reference voltage include interposing a grounded tuning fork or oscillating diaphragm between the sensing head and the photoconductive surface such that the probe is periodically exposed to a ground reference.

The current techniques for compensating for the environmental and electrical factors that affect ASV measurement, and for providing a known reference voltage to eliminate electronic drift/offset effects, make presently available ASV probes that are accurate enough for measuring ASV in an electrophotographic printing apparatus complex devices costing hundreds or thousands of dollars. As a result, these ASV probes are not cost effective to incorporate into low-to-medium cost electrophotographic printing apparatus.

SUMMARY AND OBJECTS OF THE INVENTION

Objects

The principal objects of the present invention are to provide a calibrated ASV measurement apparatus that is relatively low in cost, and that automatically compensates for changes in environmental and electrical factors—such as temperature, relative humidity and electrical circuit performance—which affect the sensitivity of low cost ASV probes, thereby insuring the accurate measurement of ASV on an imaging medium. Additional specific objects include providing a calibrated ASV measurement apparatus that (a) incorporates calibration means to automatically compensate for changes in ASV probe sensitivity due to environmental and electrical factors, (b) incorporates a calibration target capable of exposing the probe to known voltages so as to determine changes in ASV probe sensitivity due to changes in environmental and electrical factors, (c) makes use of a grounded seam on the surface of an electrophotographic drum to provide a periodic ground reference potential without having to include separate apparatus for that purpose as part of the ASV probe, and (d) uses digital processing of probe output measurements for both measuring ASV and calibrating probe sensitivity to enable added flexibility in monitoring output print quality.

Summary

Briefly, to achieve these objects and others that will be apparent to those of ordinary skill in the art, the present calibrated ASV measurement apparatus for measuring the ASV on an imaging medium (such as the photoconductive surface of an electrophotographic drum) includes (a) a probe, including a sensing head defining a sensing field, responsive to ASV on the imaging medium to provide a probe voltage output PV(t), (b) a reference potential means for periodically, during measurement intervals, exposing the probe to a reference potential GREF, and (c) a calibration target disposed in at least a portion of the probe's sensing field at least during calibration intervals, switchable between predetermined potentials $CTV_0$ and $CTV_1$.

During each measurement interval, the ASV probe is responsive to the reference potential GREF at a time $t_0$, and to the ASV on the imaging medium at a later time $t_1$ such that a differential voltage $PV(t_1) - PV(t_0)$ is obtained and ASV is determined by the following relation:

$$ASV = \frac{PV(t_1) - PV(t_0)}{K_1(t)} + GREF$$

where $K_1(t)$ is the probe sensitivity factor relating probe voltage outputs to sensed potentials (ASV and GREF). Probe sensitivity $K_1$ varies over time due to changes in environmental and electrical conditions such as temperature, relative humidity and electrical circuit performance.

During the calibration interval, while the ASV probe is responsive only to the calibration target, the calibration target is switched between potentials $CTV_0$ and $CTV_1$ at respective times $ct_0$ and $ct_1$ to provide probe voltages according to the following relation:

$$PV(ct_1) - PV(ct_0) = K_2(t) \cdot [CTV_1 - CTV_0]$$

where $K_2(t)$ is a sensitivity factor relating calibration target voltage to resulting probe voltage, which also varies with time due to changes in environmental and electrical conditions. Calibration means, responsive during each calibration interval to discrepancies between the actual differential voltage $CTV_1 - CTV_0$ applied to the calibration target and a differential voltage $(CTV_1 - CTV_0)^1$ calculated using the resulting probe voltages (i.e., $PV(ct_1) - PV(ct_0)$), develops an indication of the change in $K_2(t)$, and correspondingly recalibrates the probe sensitivity $K_1(t)$ to compensate for changes in environmental and electrical conditions, thereby insuring accurate ASV measurement during subsequent measurement intervals.

Thus, the method of the present invention comprises:
(a) Providing a probe responsive to the ASV on animaging medium;
(b) Periodically, during a measurement interval, exposing the probe to both a reference potential GREF and to ASV so as to obtain a differential probe voltage output $PV(t_1) - PV(t_0)$ from which ASV can be determined; and
(c) Periodically, during a calibration interval, recalibrating the probe sensitivity $K_1(t)$ to compensate for changes in $K_1(t)$ due to changes in environmental and electrical conditions, such that accurate ASV measurements are insured.

For a preferred embodiment in which the calibrated ASV measurement apparatus is used to measure ASV on the photoconductive surface of an electrophotographic drum, the reference potential GREF is provided by a grounded metallic seam disposed on the drum such that the ASV probe is exposed to a ground reference once each revolution of the drum. Thus, ASV is determined from the probe voltages associated with (a) the grounded seam (GREF) and (b) a portion of the photoconductive surface (ASV). In addition, the calibration target comprises a metallic target mounted to one end of the probe sensing head, occupying at least a portion of the probe's sensing field. During measurement intervals, the calibration target is held at ground potential and, therefore, does not affect ASV measurements. During calibration intervals, with the probe disposed over the grounded seam the calibration target is changed from ground potential ($CTV_0$) to a calibration reference potential ($CTV_1$) so as to obtain the differential voltage $PV(ct_1)-PV(ct_0)$ used to develop an indication of the change in the sensitivity factor $K_2(t)$.

Both ASV measurement and probe sensitivity calibration are accomplished using digital processing. Thus, probe voltages are sampled, digitized and averaged. During measurement intervals, the digitized differential voltage $PV(t_1)-PV(t_0)$, together with a digital representation of the calibrated probe sensitivity $K_1(t)$, are processed to determine a digital representation of ASV. During calibration intervals, the digitized differential voltage $PV(ct_1)-PV(ct_0)$ obtained in response to the calibration target voltages, together with a digital representation of a reference sensitivity factor $K_2(REF)$, are processed to calculate a differential calibration voltage $(CTV_1-CTV_0)'$; this calculated value and a reference value corresponding to the actual differential calibration voltage $CTV_1-CTV_0$ applied to the calibration target are processed to obtain a proportionality factor relating the actual sensitivity factor $K_2(t)$ to the reference $K_2(REF)$. This proportionality factor is then processed to recalibrate probe sensitivity $K_1(t)$ to compensate for changes in environmental and electrical factors so as to insure an accurate ASV measurement during each measurement interval.

BRIEF DESCRIPTION OF THE DRAWINGS

A more complete understanding of the present invention can be had by reference to the following detailed description of a preferred embodiment when considered in conjunction with the accompanying drawings, in which.

DESCRIPTION OF THE PREFERRED EMBODIMENT

The following detailed description of a preferred calibrated ASV measurement apparatus is with respect to its application in electrophotographic printing processes in which the imaging medium comprises the photoconductive surface of an electrophotographic drum. However, the calibrated ASV measurement apparatus can be used to provide accurate ASV measurements for any electrophotographic or electrostatic imaging medium.

Figure 1:
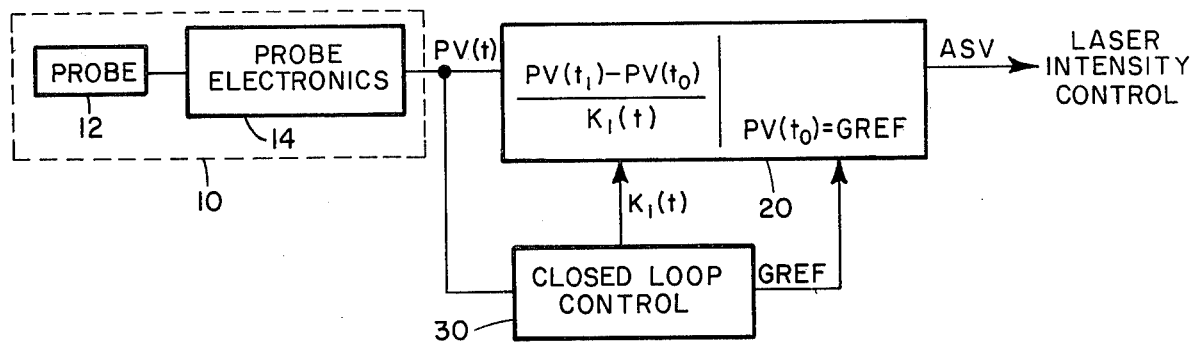
FIG. 1 is a circuit block diagram of the ASV measurement apparatus.

Referring to FIG. 1, the calibrated ASV measurement apparatus uses a commercially available ASV sensing probe 10 that includes a sensing head 12 with a defined sensing field and a probe electronics package 14. To measure the ASV (electric charge density) on a photoconductive surface, sensing head 12 is disposed adjacent the surface in position to provide ASV sensing signals. Probe electronics 14 AC couples these sensing signals, and translates them into an output probe voltage PV(t). The probe voltage PV(t) is then processed to determine ASV on the photoconductive surface.

Preferably, ASV probe 10 is a relatively low cost capacitively coupled or ammeter-type sensing probe such as the Model 1020 Electrostatic Voltmeter manufactured by Monroe Electronics. The probe voltage output from this type of probe is not suitable for accurately measuring ASV on a photoconductive surface directly because the AC coupling in the probe electronics introduces drift/offset errors, and because the probe sensitivity (i.e., the relationship between sensed ASV and the probe voltage output) varies over time due to changes in environmental and electrical conditions. The calibrated ASV measurement apparatus provides accurate ASV measurements using this type of low cost ASV probe by eliminating drift/offset errors and providing a calibration function that compensates for changes in probe sensitivity due to changes in environmental and electrical conditions.

THEORY

When used to measure a uniform voltage over an extended target (such as a photoconductive surface), the probe voltage output PV from an ASV sensing probe may be expressed as the sum of two terms:

$$PV = K(R,t) \cdot V + F(t) \qquad (1)$$

where K(R,t) is a proportionality factor that is a function of the target-to-probe spacing R, and is subject to variation with time t; V is the target voltage (relative to the probe sensor); and F(t) is a voltage that varies with time due to electronic drift and offset conditions. The factor K(R,t) is referred to as the sensitivity of the probe, and its dependence on time is a result of environmental conditions (such as temperature and relative humidity) and on electronic circuit gain variations. The other time-dependent factor, F(t), is a result of AC coupling in the probe electronics.

The probe voltage PV is of little value for direct ASV measurement because of the drift/offset term, F(t). However, because ASV measurements can be made over an interval during which F(t) is relatively constant, a differential probe voltage can be used to eliminate the drift/offset effect. If probe voltage measurements are taken during a suitably short measurement interval at times $t_0$ and $t_1$, then the differential probe voltage is defined by the equation:

$$PV(t_1) - PV(t_0) = K(t_1) \cdot V(t_1) + F(t_1) - K(t_0) \cdot V(t_0) - F(t_0) \qquad (2)$$

(The probe-to-target spacing R, which is assumed to be constant, has been dropped for convenience.) Because F(t) varies slowly with time, a measurement interval can be chosen such that $F(t_1)$ is approximately equal to $F(t_0)$. Moreover, because electronic signal drift F(t) can be expected to vary much faster than probe sensitivity K (which is primarily dependent upon slowly varying environmental effects), $K(t_1)$ and $K(t_0)$ can also be assumed to be approximately equal. Under the foregoing conditions, equation 2 reduces to:

$$PV(t_1) - PV(t_0) = K(t) \cdot [V(t_1) - V(t_0)] \quad (3)$$

While K(t) is assumed to be constant over the measurement interval ($t_0$ to $t_1$), its time-dependency characterization is retained in equation 3 in recognizition of its long-term variation due to environmental and electrical effects.

Thus, once the appropriate probe sensitivity K(t) has been determined for specific operating conditions, the differential probe voltage may be used to determine corresponding target surface voltages according to equation 3:

$$V(t_1) - V(t_0) = \frac{PV(t_1) - PV(t_0)}{K(t)} \quad (4)$$

If one of the target voltages is known, then the other target voltage can be determined in an absolute sense. For example, if during each measurement interval a probe is exposed to a known reference potential GREF ($V(t_0)$) at time $t_0$, and then to the ASV ($V(t_1)$) on a photoconductive target surface at time $t_1$, the desired ASV measurement can be determined precisely according to:

$$ASV = \frac{PV(t_1) - PV(t_0)}{K(t)} + GREF \quad (5)$$

While any known reference potential GREF can be used, if the sensing probe is exposed during each measurement interval to a ground reference potential, equation 5 becomes:

$$ASV = \frac{PV(t_1) - PV(t_0)}{K(t)} \bigg| GREF = 0 \quad (6)$$

ASV MEASUREMENT AND PROBE CALIBRATION—GENERAL

Referring to FIG. 1, the calibrated ASV measurement apparatus periodically, during successive measurement intervals $t_0$ to $t_1$, measures the ASV on a photoconductive surface by first exposing probe sensing head 12 to a ground reference potential GREF at time $t_0$, and then exposing the sensing head to the photoconductive surface at time $t_1$. The resulting probe voltages $PV(t_0)$ and $PV(t_1)$ from probe electronics 14 are processed according to equation 6, as indicated in block 20, to obtain the desired ASV measurement. Over successive measurement intervals the probe sensitivity K(t), which is constant over any given measurement interval, changes due to previously discussed, time-varying environmental and electrical effects. To insure continuously accurate ASV measurements, the calibrated ASV measurement apparatus periodically recalibrates the probe sensitivity K(t), providing closed loop control as indicated by block 30.

Calibration Target

Closed loop calibration is provided by using a calibration target, to which known voltages can be applied during periodic calibration intervals, to monitor changes in probe sensitivity with respect to the calibration target, thereby permitting probe sensitivity to be recalibrated to compensate for those changes.

Rewriting equation 4, the probe sensitivity factor K(t) can be expressed as:

$$K(t) = \frac{PV(t_1) - PV(t_0)}{V(t_1) - V(t_0)} \quad (7)$$

Thus, probe sensitivity K(t) can be determined by applying known voltages V(t) to a target surface, recording the resulting probe voltages PV(t), and processing this information according to equation 7.

In the case of an electrophotographic printing system, ASV probe sensitivity K(t) can be initially determined straightforwardly by (a) mounting the probe's sensing head adjacent the photoconductive surface (thereby fixing the probe-to-target spacing R), (b) providing known voltages on the photoconductive surface such as by using temporarily affixed metallic strips or targets, (c) recording the resulting probe voltage outputs, and (d) calculating K(t) using equation 7. During electrophotographic printing operations, however, periodically exposing the probe sensing head to known voltages is more difficult because the potential on the photoconductive surface cannot be precisely controlled.

To continuously monitor probe sensitivity K(t), the calibrated ASV measurement apparatus uses a separate calibration target, to which known voltages can be applied, disposed a fixed distance R' from the probe so as to occupy at least a portion of the probe's sensing field. When an ASV probe is exposed to two fixed targets, such as a photoconductive surface and a calibration target, the relationship between target voltages and probe voltage output in equation 1 becomes:

$$PV = K_1(t) \cdot V_1(t) + K_2(t) \cdot CTV(t) + F(t) \quad (8)$$

where $K_1(t)$ is the probe sensitivity factor with respect to the photoconductive surface target, which carries a voltage $V_1(t)$, and $K_2(t)$ is the probe sensitivity factor with respect to the calibration target, which carries a voltage CTV(t).

If the calibration target voltage CTV(t), is held at ground potential, the probe voltage output in equation 8 becomes:

$$PV = K_1(t) \cdot V_1(t) + F(t) \quad (9)$$

This expression is similar to equation 1 which characterizes probe voltage output when no calibration target is present. Thus, the probe in an ASV measurement apparatus using a calibration target behaves similar to a probe without a calibration target as long as the calibration target is held at ground potential, and ASV measurements can be obtained without regard to the presence of the calibration target.

A similar analysis leads to the following expression relating probe voltage to calibration target voltage:

$$PV = K_2(t) \cdot CTV(t) + F(t) \quad (10)$$

Thus, if during a calibration interval the probe's sensing head is constrained to sense only the voltage on the calibration target, either by introducing a ground potential into that portion of the sensing field not occupied by the calibration target, or by causing the calibration target to occupy the entire sensing field during the calibration interval, then the sensitivity factor $K_2(t)$ associated with the calibration target can be determined directly in accordance with equation 7. That is, if during the calibration interval the calibration target is switched between known potentials $CTV_0$ and $CTV_1$ at, respectively, times $ct_0$ and $ct_1$, then:

$$K_2(t) = \frac{PV(ct_1) - PV(ct_0)}{CTV_1 - CTV_0} \tag{11}$$

where $PV(ct_1)$ and $PV(ct_0)$ are the probe voltage responses to, respectively, calibration target voltages $CTV_1$ and $CTV_0$.

The relative sensitivities of the probe sensitivity factors associated with (a) the photoconductive surface ($K_1$) and (b) the calibration target ($K_2$) are substantially constant, i.e.:

$$K_1(t) = A \cdot K_2(t) \tag{12}$$

where A is a proportionality constant relating the probe sensitivity factors. Thus, if during a calibration interval the calibration target sensitivity factor $K_2$ is determined, or an indication of the change in $K_2$ with respect to a reference sensitivity is provided, then the probe sensitivity $K_1$ used to determine ASV can be correspondingly recalibrated. Recalibrating $K_1(t)$ during a calibration interval compensates for the changes in environmental and electrical circuit factors affecting probe sensitivity, and permits accurate measurement of ASV on the photoconductive surface during subsequent measurement intervals.

Method

To summarize, the method embodied in the calibrated ASV measurement apparatus comprises:
 (a) Determining an initial value for the probe sensitivity factor $K_1(t)$;
 (b) Periodically, during measurement intervals, exposing the probe sensing head to a ground reference potential GREF and then to ASV on the photoconductive surface to obtain a differential probe voltage $PV(t_1) - PV(t_0)$;
 (c) Processing this differential voltage and the value for the probe sensitivity $K_1(t)$ according to equation 6 to obtain the desired ASV measurement; and
 (d) Periodically recalibrating probe sensitivity $K_1(t)$ to compensate for variations due to changes in environmental and electrical conditions.

The procedure for recalibrating probe sensitivity $K_1(t)$ comprises:
 (a) Determining an initial reference sensitivity value $K_2(REF)$ associated with a calibration target;
 (b) Periodically, during calibration intervals, exposing the probe only to known voltages $CTV_0$ and $CTV_1$ on the calibration target to obtain a differential probe voltage $PV(ct_1) - PV(ct_0)$;
 (c) Processing this differential voltage and reference sensitivity value $K_2(REF)$ according to equation 11 to obtain an indication of the change in the sensitivity factor $K_2(t)$ relative to $K_2(REF)$; and
 (c) Recalibrating the probe sensitivity factor $K_1(t)$ in accordance with the change in $K_2(t)$.

ASV MEASUREMENT AND PROBE CALIBRATION—PREFERRED

Figure 2:
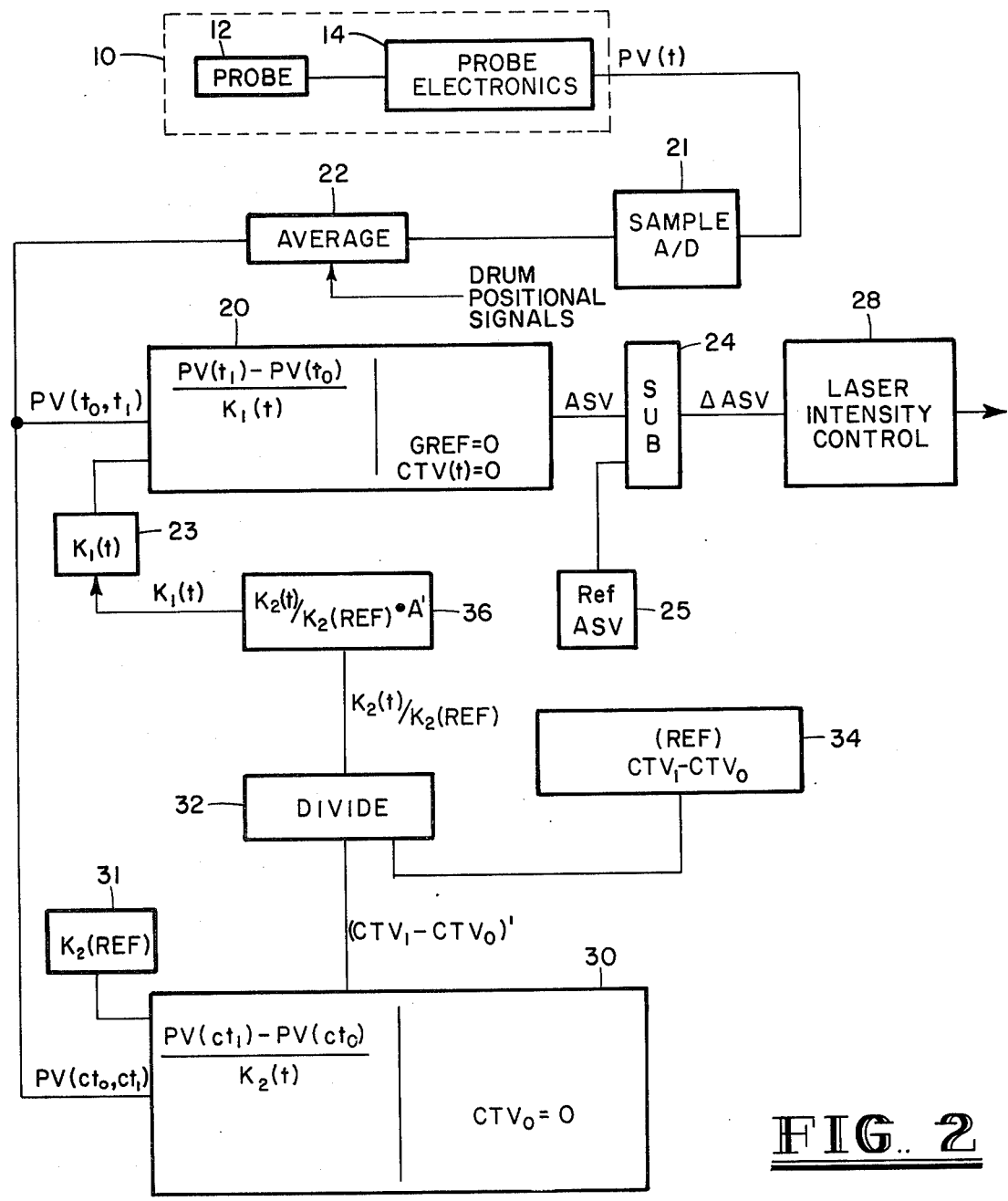
FIG. 2 is a more detailed circuit block diagram illustrating both ASV measurement and probe sensitivity calibration.

The preferred calibrated ASV measuring apparatus implements the above method using digital processing. Referring to FIG. 2, ASV probe 10 is mounted in an electrophotographic engine (not shown) such that probe sensing head 12 is disposed adjacent the photoconductive surface of the electrophotographic drum at a fixed spacing R, in position to sense potentials on the photoconductive surface. As described below in conjunction with FIGS. 4a–4c, the calibration target used in recalibrating probe sensitivity is mounted directly to the housing of probe sensing head 12 at a fixed distance R'. As indicated previously, probe 10 (including probe sensing head 12 and probe electronics 14) comprises a commercially available capacitively couple or ammeter-type ASV sensing probe that provides a probe voltage output PV in response to potentials sensed by the sensing head.

The analog probe voltage PV(t) from probe electronics 14 is applied to a network 21 that samples PV(t) and converts these samples to a digital representation. The digitized samples representative of probe voltage PV(t) are applied to an averaging network 22 responsive to drum position signals to average a predetermined number of samples for each desired probe voltage measurement, i.e., those at times $t_0$ and $t_1$ of the measurement interval and at times $ct_0$ and $ct_1$ of the calibration interval. Thus, each of the times $t_0$ and $t_1$ and $ct_0$ and $ct_1$ actually represents a small interval during which a predetermined number of digitized samples of the corresponding probe voltage PV(t) are averaged to provide a single probe voltage measurement. For example, a preferred calibrated ASV measurement apparatus has been implemented in which each probe voltage measurement comprises an average of either 8 or 16 samples.

The drum positional signals that control average network 22 are available from a drum encoder wheel in the electrophotographic engine. These positional signals, indicative of the electrophotographic drum's angular positioning are used to develop timing signals indicative of the relative positions of the electrophotographic drum and the probe sensing head, which control the averaging function during the measurement and calibration intervals.

After averaging, the digital probe voltage measurements are applied to a microprocessor that performs the various arithmetic operations described below.

ASV Measuring

In each measurement interval $t_0$ to $t_1$, probe voltage measurements $PV(t_0)$ and $PV(t_1)$ are obtained from average network 22. During each measurement interval, the calibration target is held at ground potential and, therefore, does not participate in the ASV measuring process.

These probe voltages are obtained by exposing probe sensing head 12 to (a) a reference voltage GREF at time $t_0$ to obtain probe voltage $PV(t_0)$, and (b) to the ASV on the photoconductive surface at time $t_1$ to obtain probe voltage $PV(t_1)$. After sampling, digitizing and averaging, the probe voltages $PV(t_0)$ and $PV(t_1)$ are then processed according to equation 6, as indicated in block 20, to obtain the ASV measurement for that measurement interval. That is, the digitized probe voltages are appropriately summed to obtain the differential probe voltage $PV(t_1) - PV(t_0)$, and then divided by the current value for probe sensitivity $K_1(t)$ which relates probe voltage to sensed ASV. The current value for probe sensitivity $K_1(t)$ is stored in a memory location 23 for use during each measurement interval. After being initially determined, $K_1(t)$ is periodically recalibrated, and the recalibrated value stored in memory location 23, to continuously compensate for changes in probe sensitivity due to environmental and electrical factors, thereby insuring an accurate ASV determination.

For the preferred embodiment, the reference potential GREF is ground, while probe voltage $PV(t_1)$ corresponds to the sensed ASV from a portion of the photoconductive surface presenting an all background image (i.e., devoid of any print image). Thus, the differential voltage $PV(t_1)-PV(t_0)$ corresponds to background ASV relative to a ground reference potential. As previously discussed, one important parameter of output print quality is that background ASV should be within a defined range to insure a clean background, and it is this parameter that is being monitored using probe voltage measurements $PV(t_1)$.

The ASV measurements obtained during successive measurement intervals can be used in a feed-back mode to maintain the ASV on the photoconductive surface within predetermined ranges despite changes in environmental and electrical factors that affect ASV, such as by making optical (e.g. laser) or electrical (e.g. corona) adjustments in the electrophotographic process. For example, the calibrated ASV measurement apparatus has been used to adjust laser intensity so as to maintain background ASV on a photoconductive surface within a desired range. To that end, the digital ASV measurement obtained each measurement interval through processing according to block 20 is applied to one input of a subtractor 24. A reference ASV value from a memory location 25 is applied to the other subtractor input so that subtractor 24 outputs a digital representation of the change in actual ASV with respect to the desired reference ASV. This ASV change indication is applied to a laser intensity control network 28 that adjusts laser intensity to provide the desired background ASV.

Recalibration of Probe Sensitivity

Initially, the probe sensitivity $K_1(t)$ associated with the photoconductive surface is determined in accordance with equation 7. That is, prior to commencing printing operations, probe sensing head 12 is mounted a distance R from the photoconductive surface. With the sensing head's integral calibration target held at ground potential, initial calibration voltages are applied to the photoconductive surface and the probe sensing head is exposed to these voltages. For a preferred embodiment, two aluminum foil strips are temporarily affixed to the photoconductive surface, predetermined potentials are applied, and the drum is rotated to position the strips successively beneath the probe sensing head. The resulting probe voltage outputs are recorded, and the initial value for $K_1(t)$ is calculated, with a digital representation of this initial probe sensitivity being stored in memory location 23.

During subsequent electrophotographic printing operations, the probe sensitivity $K_1(t)$ is periodically recalibrated as follows.

In each calibration interval $ct_0$ to $ct_1$, the probe sensing head is responsive to known voltages placed on its calibration target and corresponding probe voltage measurements $PV(ct_0)$ and $PV(ct_1)$ are obtained from average network 22. During each calibration interval, sensing head 12 is responsive only to potentials on the calibration target, i.e., the remainder of the probe's sensing field not occupied by the calibration target is at ground potential.

These probe voltages are obtained by placing on the calibration target (a) a predetermined potential $CTV_0$ at time $ct_0$ to obtain probe voltage $PV(ct_0)$, and (b) a predetermined potential $CTV_1$ at time $ct_1$ to obtain probe voltage $PV(ct_1)$. Preferably, the initial calibration voltage $CTV_0$ is ground. After sampling, digitizing and averaging, these probe voltages are then processed in accordance with equation 11, as indicated by block 30. That is, the probe voltages are first summed to obtain a differential voltage $PV(ct_1)-PV(ct_0)$, and then divided by a reference sensitivity factor $K_2(REF)$ associated with the calibration target. The reference sensitivity factor is initially calculated in accordance with equation 11, and a digital representation of $K_2(REF)$ is stored in a memory location 31.

The above arithmetic processing yields a calculated value $(CTV_1-CTV_0)'$ for the differential calibration voltage applied to the calibration target. By analyzing the change in this calculated differential calibration voltage $(CTV_1-CTV_0)'$ with respect to the actual differential voltage $CTV_1-CTV_0$ applied to the calibration target, an indication of the change in the sensitivity factor $K_2(t)$ with respect to the reference sensitivity factor $K_2(REF)$ as a result of changes in environmental and electrical conditions can be obtained. Specifically, the calculated differential voltage $(CTV_1-CTV_0)'$ is applied to one input of a divide network 32, with the other input being a reference value corresponding to the actual differential voltage applied to the calibration target. For each calibration interval, the output from divide network 32 corresponds to a ratio of the actual sensitivity factor $K_2(t)$ to the reference sensitivity factor:

$$\frac{CTV_1 - CTV_0}{(CTV_1 - CTV_0)'} \propto \frac{K_2(t)}{K_2(REF)} \quad (13)$$

Once the ratio $K_2(t)/K_2(REF)$ representative of the change in the sensitivity factor $K_2$ associated with the calibration target is determined, the recalibrated value for the probe sensitivity $K_1(t)$ associated with the photoconductive surface can be calculated in accordance with equation 12, as indicated by block 36. Thus, the recalibrated probe sensitivity $K_1(t)$ is obtained in accordance with the following relation:

$$K_1(t) = \frac{K_2(t)}{K_2(REF)} \cdot A' \quad (14)$$

where the proportionality factor $A'$ corresponds to the reference value $K_2(REF)$ multiplied by the constant A in equation 12. The recalibrated probe sensitivity $K_1(t)$, adjusted for changes in environmental and electrical conditions, is then stored in memory location 23 for use during subsequent measurement intervals to obtain an accurate representation of the ASV on the photoconductive surface.

The use of equation 14 to obtain a recalibrated value for probe sensitivity $K_1$ assumes that the ratio of $K_1$ and $K_2$ remains constant. The primary factor that might be expected to change this sensitivity ratio is contamination of the probe sensing surface by stray toner particles, which could alter the resistive and/or capacitive characteristics of the probe. In practice, this toner contamination effect was tested by thoroughly dusting the probe sensing surface with toner particles, and an insignificant (less than one percent) change in probe sensitivity was observed.

Probe Head and Calibration Target

Figure 4A:
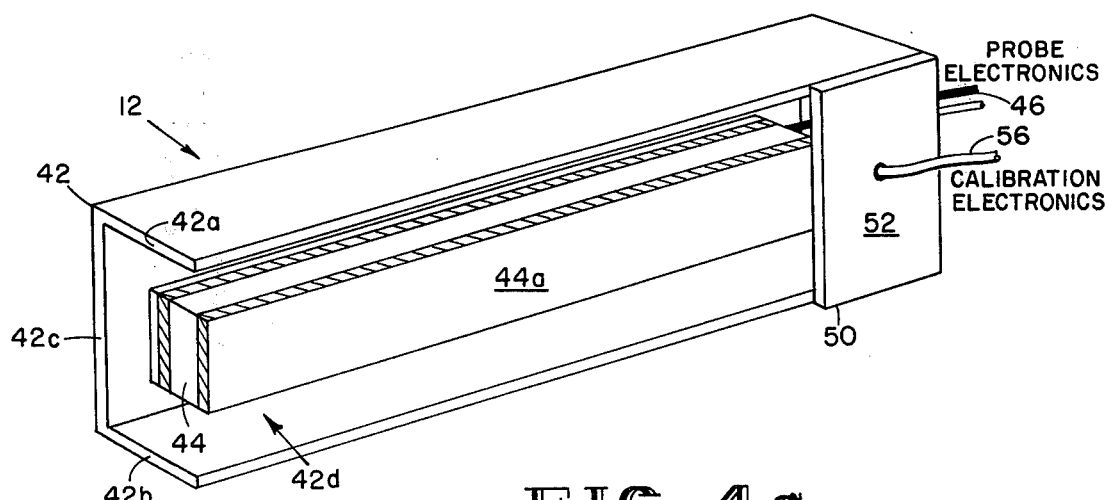
FIG. 4a is an isometric view.
Figure 4B:
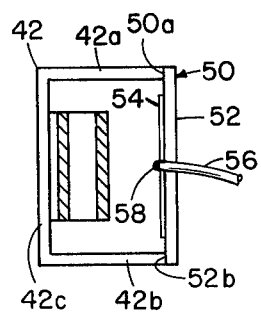
FIG. 4b is an end view.
Figure 4C:
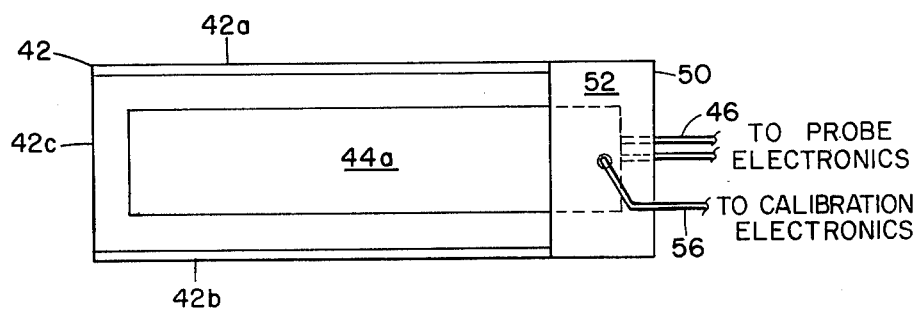
FIG. 4c is a plan view of an ASV probe sensing head showing the calibration target affixed to one end.

Referring to FIGS. 4a, 4b and 4c, probe sensing head 12 is of a conventional type provided with commercially available, low-cost ASV probes. It includes an elongate, U-shaped metallic housing 42 formed by flanges 42a and 42b and a connecting member 42c to define a sensing window 42d. A sensing element 44 is disposed within housing 42 and attached to the inner surface of connecting member 42c, such that a sensing surface 44a is adjacent sensing window 42d. Probe leads 46 connect sensing element 44 to the probe electronics package (see FIG. 1).

A calibration target 50 is mounted directly to housing 42. Calibration target 50 is formed by an non-conducting plate 52 having attached to one side a metallic conducting layer 54, and is affixed to one end of housing 42, with shoulder portions 52a and 52b of non-conducting plate 52 contacting the ends of, respectively, flanges 42a and 42b. Thus, calibration target 50 occupies a portion of the sensing window 42d of housing 42, being disposed in a corresponding portion of the sensing field of probe sensing element 44. Conducting layer 54 is configured such that, when calibration target 50 is mounted to housing 42, the conducting layer does not contact the metallic flanges 42a and 42b.

For a preferred embodiment, calibration target 50 is configured to cover approximately fifteen percent of the sensing field of sensing element 44, being formed from conventional, printed circuit board material, with chemical etching being used to remove the conducting copper from shoulder portions 52a and 52b to define conductive layer 54. The size of calibration target 50, and the corresponding portion of the probe's sensing field that it covers, are matters for design. Moreover, the calibration target need not be attached to housing 42, and need not be permanently disposed in the probe's sensing field so long as it is positionable a fixed distance R' from sensing element 44 during calibration intervals.

An electrical lead 56 is disposed through a hole in non-conducting plate 52 to form a contact 58 on conductive layer 54. Electrical lead 56 is used to control the potential on the conducting layer of calibration target 50. During the measurement intervals in which the calibrated ASV measurement apparatus is used to measure ASV, conducting layer 54 is held to ground potential so that the calibration target, even though disposed in a portion of the sensing field of sensing element 44, does not affect the ASV measurements. During each calibration interval, the potential on conducting layer 54 of calibration target 50 is raised from ground ($CTV_0$) to a preselected potential ($CTV_1$) to enable probe sensitivity to be recalibrated.

Figure 5:
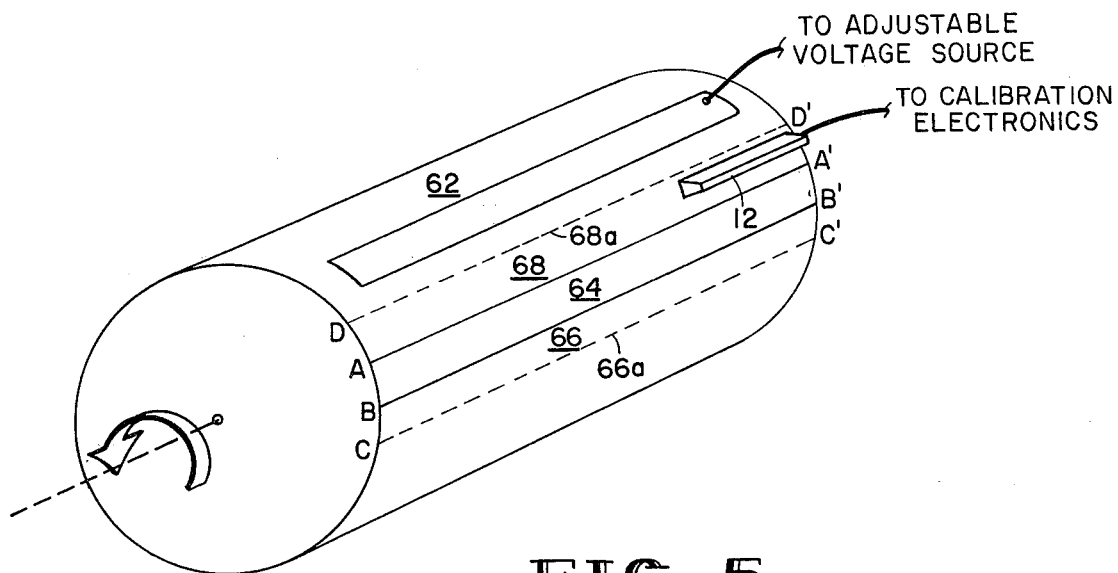
FIG. 5 is a schematic drawing of an electrophotographic drum with a probe disposed adjacent to one end.

To develop the probe voltages that are used for both ASV measurement and probe calibration, probe sensing head 10 is mounted a fixed distance R from the surface of an electrophotographic drum, in position to sense the voltages appearing on the drum surface. Referring to FIG. 5, housing 42 of probe head 12 is mounted (in a manner not shown) at one end of the electrophotographic drum with its sensing window adjacent the drum surface. Because edge effects cause the probe's sensing field to extend slightly beyond its sensing window (42d), probe head 12 should be positioned at least approximately one inch in from the edge of the photoconductive surface to avoid sensing biases introduced by the edge of the photoconductive surface. Thus, the probe sensing field comprises the photoconductive surface except for that portion occupied by calibration target 50 (see FIG. 4c).

Specifying an appropriate probe-to-drum surface spacing R involves two interrelated considerations. First, probe sensitivity is inversely related to R according to the following functional form:

$$K = a/R + b \tag{15}$$

where a and b are constants. Thus, a given change in R will cause a more significant change in probe sensitivity when R is small with respect to the constant than otherwise. Because deviations in the probe-to-drum surface spacing attributable to mechanical tolerances are unavoidable, R should be sufficiently large to minimize corresponding changes in probe sensitivity. As a countervailing consideration, reducing the probe-to-drum surface spacing also reduces the probe's sensing field, permitting narrowly focused probe measurements. For the exemplary Monroe Electronics Model 1020 ASV probe, having a sensing head 6 cm in length by 0.5 cm in width by 0.25 cm in depth, a probe-to-drum surface spacing R of 3 to 5 mm was observed to provide both a probe sensitivity that is relatively constant with changes in R due to mechanical tolerances and an acceptably narrow sensing field.

Grounded Seam

Electrophotographic drum 60 is of a type having a cylindrical surface formed by a photoconductive layer 62 and a narrow metallic seam 64. The metallic seam is grounded, and provides probe sensing head 12 with a ground reference potential GREF once every revolution of the drum. By taking advantage of an existing grounded seam on the drum surface, the preferred calibrated ASV measurement apparatus obtains the periodic ground reference potential (and resulting differential probe voltages) needed to eliminate electronic drift/offset effects, without including separate means for this purpose as part of the probe sensing head. Such an approach to providing a periodic ground reference potential is not required; conventional reference means associated with the probe sensing head can be used in connection with the calibration function of the present invention (see discussion below with reference to FIG. 6). However, the preferred approach permits increased cost savings and reliability in practicing the invention.

Electrophotographic drum 60 is of sufficient circumference that printing paper of a maximum length requires an imaging photoconductive surface extending only from a leading borderline 66a counterclockwise to a trailing borderline 68a, leaving border strips 66 and 68 of photoconductive surface 62 that are not used for imaging. For a preferred embodiment, the calibrated ASV measurement apparatus uses one of these border strips—for example, leading edge border strip 66—for taking the probe voltage measurements associated with the photoconductive surface which, together with the probe voltage measurements associated with the grounded seam, are used to determine ASV.

As previously discussed, the preferred application for the calibrated ASV measurement apparatus is to monitor the background ASV on a photoconductive surface so as to enable an electrophotographic printing/imaging process to consistently provide printed output exhibiting a clean background. For example, the Background portion of this specification describes an electrophotographic imaging apparatus in which a clean background corresponds to an ASV on the photoconductive surface of between −60 and −90 volts. Outside this range, the background cleaness of the printed output deteriorates. The calibrated ASV measurement apparatus can be used to insure that background ASV remains within such a preselected range despite changes in the environmental and electrical factors that affect ASV. Because border strips 66 and 68 are not used for imaging, they can be brought to a background ASV potential each revolution to enable the calibrated ASV measurement apparatus to monitor background ASV regardless of the type or amount of print imaging that is done on the remainder of photoconductive surface 62.

Probe/Drum Operation

Figure 3A:
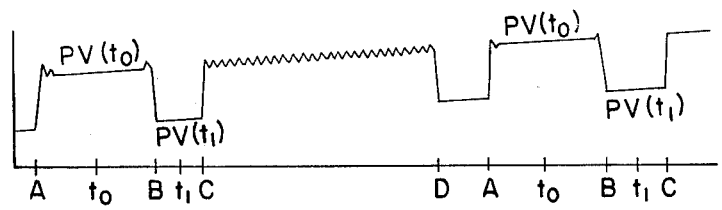
FIGS. 3a and 3b are waveforms representing probe voltage outputs.

The operation of the preferred calibrated ASV measurement apparatus in conjunction with electrophotographic drum 60 will now be described. Referring to the waveform in FIG. 3a and FIG. 5, the probe voltages that correspond to the times A, B, C, and D are derived from the potentials sensed by probe sensing head 12 as the lines AA′, BB′, CC′, and DD′ on photoconductive drum 60 rotate beneath it.

That is, at the beginning of each drum revolution at time A, the leading edge of grounded seam 64 (designated AA′) passes under probe head 12 so that, between times A and B, probe head 12 senses the ground reference potential on the grounded seam, and a corresponding probe voltage is obtained. At time B, the boundary (designated BB′) between grounded seam 64 and leading border strip 66 passes under probe head 12, and the resulting probe voltage falls rapidly to a value corresponding to the background ASV (eg., −60 to −90 volts) on the border strip. Between time B and at least time C, the time when borderline 66a (designated CC′) passes under probe head 12, the probe voltage corresponds to background ASV. At some time after time C, the portions of photoconductive surface 62 on which a print image is formed pass under probe sensing head 12, and the resulting probe voltage output will correspond to an electrophotographic image having a print image superimposed on a background image. At least by time D, the time when borderline 68a (designated DD′) passes under probe head 12, the imaging portion of photoconductive surface 62 will have passed beneath probe sensing head 12 and the resulting probe voltage will correspond to the background ASV on trailing border strip 68, until the leading edge AA′ of grounded seam 64 passes under the sensing head.

Two surface areas of electrophotographic drum 60 are monitored to develop the probe voltage measurements used to determine background ASV on photoconductive surface 62. Between times A and B, while probe sensing head 12 is over grounded seam 64, a probe voltage measurement $PV(t_0)$ corresponding to the ground reference is obtained at time $t_0$. Similarly, between times B and C, while probe sensing head 12 is over leading border strip 66, a probe voltage measurement $PV(t_1)$ corresponding to background ASV is obtained at time $t_1$.

As discussed previously with reference to FIG. 2, these probe voltage measurements are obtained by sampling, digitizing and averaging the probe voltage outputs from ASV probe 10 at times $t_0$ and $t_1$ of the measurement interval, and are then processed according to equation 6 (block 20) to obtain the desired background ASV measurement for each measurement interval. In that regard, the differential probe voltage $PV(t_1) - PV(t_0)$ corresponds to background ASV relative to a ground reference potential despite drift/offset effects that change the absolute value of the probe voltage measurement corresponding to background ASV $(PV(t_1))$. The accuracy of the ASV measurements obtained by processing probe voltages $PV(t_0)$ and $PV(t_1)$ according to block 20 is insured by periodically recalibrating the probe sensitivity $K_1(t)$ to compensate for changes in environmental and electrical conditions.

During the periodic calibration intervals, grounded seam 64 is used to insure that probe sensing head 12 responds only to the potentials on the calibration target. That is, probe voltage measurements during the calibration interval $ct_0$ to $ct_1$ are made only while probe sensing head 12 is over grounded seam 64, so that the portion of the probe's sensing field not occupied by the calibration target is exposed to the ground reference potential on the seam. While the probe voltage measurements associated with the calibration target can be made during operation of the drum (so long as the probe sensing head is over the grounded seam), for a preferred embodiment such measurements are made during the idle time between printing operations, with the drum being caused to stop with its grounded seam under the probe sensing head.

Although the preferred embodiment uses the border strip portion of photoconductive surface 62 to obtain probe voltage measurements of background ASV, any other portion of the photoconductive surface that exhibits background ASV (i.e., no superimposed print image) can be used. For example, a non-imaging test cycle could be used in which the entire photoconductive surface was brought to background ASV, with ASV measurements being made at any point on the photoconductive surface. Such a test cycle for providing background ASV measurements would probably be required if, for example, the calibrated ASV measurement apparatus were used in conjunction with an electrophotographic drum have a circumference smaller than a maximum paper length.

The preferred embodiment has been described with reference to using the calibrated ASV measurement apparatus to accurately determine background ASV in an electrophotographic printing process because a clean background is the most important indicia of high quality print output. However, the calibrated ASV measurement apparatus can also be used to monitor the other important aspect of print quality—print darkness. To do this, the ASV in an extended solid print portion of an electrophotographic image must be monitored. For example, for the electrophotographic process described in the Background, the ASV associated with the print unexposed portion of an electrophotographic image is preferably in the range of 400 to 500 volts. For the preferred embodiment, print-image ASV was permitted to float while the calibrated ASV measurement apparatus concentrated on insuring that the background-image ASV remained within its predetermined range.

In the case of the preferred electrophotographic drum, one technique for monitoring print ASV is to provide a solid print image on border strip 66. Then, during a measurement interval, the differential voltage $PV(t_1) - PV(t_0)$ will correspond to print ASV relative to the reference ground.

Figure 3B:
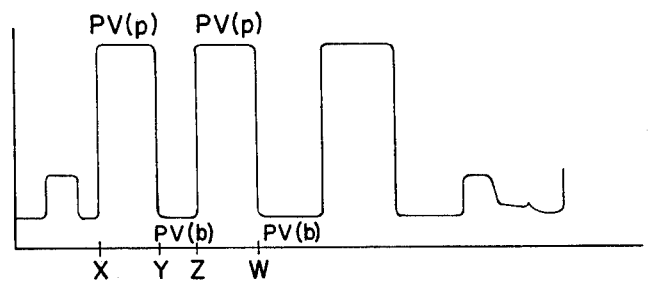

Another technique for monitoring print ASV is to periodically image a test pattern of alternate print (e.g.

black) and background (e.g. white) bars on the photoconductive surface. Referring to the waveform in FIG. 3b, between times X and Y, an entire strip of photoconductive surface is brought to an ASV corresponding to a print image. Subsequently, between times Y and W a bar of background-image ASV is formed, while between times W and Z another bar of print-image ASV is formed, and so forth. The resulting probe voltage outputs will alternate between a probe voltage PV(b) corresponding to background image ASV and PV(p) corresponding to print image ASV. From this test pattern, a differential probe voltage can be developed using the probe voltage measurements PV(p) and the reference ground to determine the print ASV in an absolute sense. If print ASV is outside its predetermined range, even though background ASV is within its predetermined range, adjustments can be made in laser intensity and/or corona amplitude to correct for the discrepancy in print ASV. Moreover, background ASV can be monitored using any one of the background-image bars of the test pattern.

The test pattern technique is particularly useful if it is desired to measure print or background ASV at various points on the photoconductive surface. For the preferred electrophotographic drum, however, where the ground reference is provided by a grounded seam once per revolution, the time between a ground reference measurement ($t_0$) and an ASV measurement ($t_1$) may become sufficiently long that electronic drift/offset effects are not cancelled by using the differential voltage $PV(t_1) - PV(t_0)$ (see equations 2 and 3 and the associated discussion). A straightforward solution is to take a second ground reference measurement at $t_0'$ and, because electronic drift/offset effects are approximately linear, simply interpolate to obtain the actual probe voltage corresponding to ground reference at the ASV measurement time $t_1$.

ALTERNATE EMBODIMENT

The preferred embodiment uses a grounded seam on the surface of an electrophotographic drum to provide (a) a periodic (once per revolution) ground reference potential, and (b) a ground target for the probe sensing head such that, during calibration intervals, the probe responds only to potentials on the calibration target. However, the calibrated ASV measurement apparatus may also be used in conjunction with electrophotographic drums that do not provide such a grounded seam. Included in this category are the small, continuous printing electrophotographic drums currently being developed which have a circumference of less than the length of a printed page. Although avoiding the cost of separate ground reference means minimizes the cost for the calibrated ASV measurement apparatus, even when such ground reference means must be provided, significant cost savings are achieved because the calibration function of the present invention enables accurate ASV measurements to be obtained using relatively low cost ASV probes.

Figure 6:
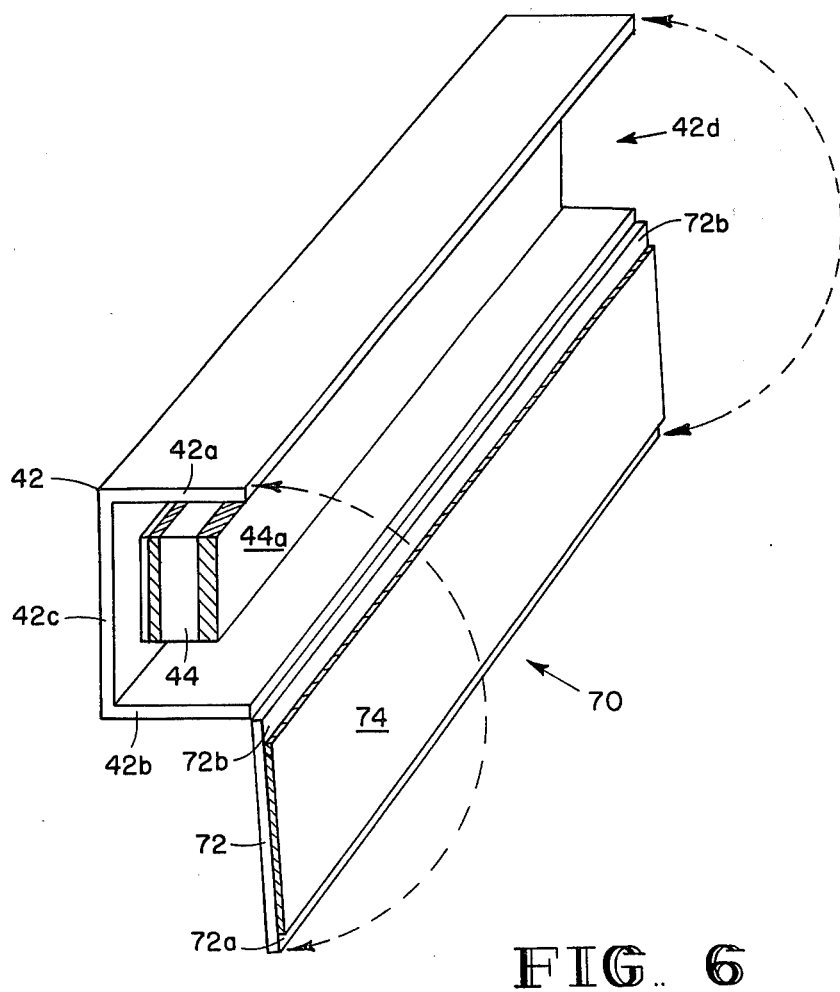
FIG. 6 is an isometric view of a probe sensing head showing an alternate embodiment in which the calibration target is formed by a flap that swings into and out of the probe's sensing field.

An example of an alternate embodiment in which the calibrated ASV measurement apparatus includes ground reference potential means is shown in FIG. 6. Probe 10 includes a flap 70 that can be pivoted (by means not shown) between the retracted position shown, and an engaged position in which both shoulders 72a and 72b contact corresponding portions of flanges 42a and 42b of housing 42. Flap 70 is formed in the same manner as calibration target 50 with non-conducting plate 72 having disposed on one surface a conducting layer 74, leaving non-conducting elongate shoulders 72a and 72b. Flap 70 is configured such that, when engaged over the sensing window in housing 42, conducting layer 74 occupies the entire sensing field of sensing element 44. Electrical means (not shown) are provided to enable predetermined potentials to be placed on conductive layer 74. Of course, the precise electromechanical means used to pivot or otherwise translate flap 70 into and out of the probe's sensing field is a matter for design.

In this alternate embodiment, flap 70 functions both to provide a periodic reference potential (for example, ground) used to obtain differential probe voltages during measurement intervals, and to provide a calibration target for periodically exposing sensing element 44 to known potentials during calibration intervals. For the calibration function, because Flap 70 occupies the probe's entire sensing field during calibration intervals, the probe is reponsive only to the calibration potentials placed on conductive layer 74.

CONCLUSION

The present invention has been described in relation to a preferred calibrated ASV measurement apparatus for providing accurate measurements of ASV on the photoconductive surface of an electrophotographic drum, using a relatively low cost ASV probe despite changes in ASV probe sensitivity due to variations in environmental and electrical conditions. In particular, the calibrated ASV measurement apparatus is used to monitor the most important indicia of print quality—background ASV. A calibration target is used to periodically monitor the changes in ASV probe sensitivity that affect the accuracy of ASV probe voltage output and, therefore, ASV measurement. By applying known voltages to the calibration target during periodic calibration interval, an indication of a change in probe sensitivity with respect to the calibration target can be calculated, and used to recalibrate the value for probe sensitivity with respect to ASV on the photoconductive surface. During ASV measurement intervals, the calibrated value for probe sensitivity is used in processing a differential probe voltage corresponding to background ASV with respect to a ground reference potential to eliminate drift/offset effects, and obtain an accurate background ASV measurement. The periodic ground reference potential is provided by a grounded seam on the surface of the electrophotographic drum, which avoids the cost of providing separate reference potential means as part of the calibrated ASV measurement apparatus. The probe voltage outputs from the ASV probe are processed digitally to obtain both periodic ASV measurements, and periodically recalibrated values for probe sensitivity.

While the invention has therefore been described with respect to a preferred embodiment, those skilled in the art will understand that the invention is not limited to that embodiment, but rather that the limits of the invention are to be interpreted only in conjunction with the appended claims.

The embodiments of the invention in which an exclusive property or privilege is claimed are as follows:

1. Apparatus for measuring the apparent surface voltage (ASV) on an electrostatic/electrophotographic imaging medium (such as the photoconductive surface of an electrophotographic drum) using a relatively low cost ASV probe, periodically recalibrating probe sensitivity to compensate for variations in environmental and electrical conditions such as temperature, relative humidity, and electrical circuit performance, the calibrated ASV measurement apparatus comprising:

(a) a probe, including a sensing head with a defined sensing field, responsive to ASV on the imaging medium to provide (for a given probe-to-medium spacing) a probe voltage output PV according to the following relation:

$$PV = K_1(t) \cdot ASV + F(t)$$

where probe sensitivity $K_1(t)$ varies over time due to changes in environmental and electrical conditions, and $F(t)$ is a voltage that varies with time due to electronic drift and offset effects;

(b) GREF potential means for periodically, during a measurement interval, exposing said probe to a reference potential GREF at time $t_0$ such that when said probe is exposed to the ASV on the imaging medium at some later time $t_1$, a differential probe voltage $PV(t_1) - PV(t_0)$ is obtained and ASV can be determined according to the following relation:

$$ASV = \frac{PV(T_1) - PV(t_0)}{K_1(t)} + GREF$$

(c) a calibration target, disposed in at least a portion of said probe's sensing field at least during periodic calibration intervals, switchable between two predetermined potentials $CTV_0$ at time $ct_0$ and $CTV_1$ at time $ct_1$, said probe being responsive only to the potentials on said calibration target during the calibration interval such that a differential probe voltage $PV(ct_1) - PV(ct_0)$ is derived from the potentials on the calibration target according to the following relation:

$$CTV_1 - CTV_0 = \frac{PV(ct_1) - PV(ct_2)}{K_2(t)}$$

where $K_2(t)$ is a sensitivity factor associated with the calibration target which varies over time with changes in environmental and electrical conditions in a corresponding manner to the probe sensitivity $K_1(t)$;

(d) calibration means responsive to the differential probe voltage $PV(ct_1) - PV(ct_0)$ obtained during each calibration interval to provide an indication of the change in the sensitivity factor $K_2(t)$ for the calibration target, and to correspondingly recalibrate probe sensitivity $K_1(t)$ to compensate for variations in environmental and electrical conditions, thereby insuring accurate ASV measurements.

2. The calibrated ASV measurement apparatus defined in claim 1 wherein:

(a) said calibration target is mounted to said probe's sensing head interposed in a portion of the sensing field such that the remaining portion of the sensing field encompasses the imaging medium;

(b) said calibration target being held at ground potential during measurement intervals such that ASV measurement is not affected by the presence of said calibration target.

3. The calibrated ASV measurement apparatus defined in claim 2 wherein said calibration target is translatable periodically into a position occupying said probe's entire sensing field, said calibration target providing the referenced potential GREF during the measurement intervals and the predetermined potentials $CTV_0$ and $CTV_1$ during the calibration intervals.

4. The calibrated ASV measurement apparatus defined in claim 2 wherein said calibration means includes:

(a) means for providing an indication of the change in the sensitivity factor $K_2$ with respect to a reference value;

(b) means responsive to the sensitivity change indication to provide a calibrated probe sensitivity $K_1(t)$ for use in determining ASV during subsequent measurement intervals.

5. The calibrated ASV measurement appartaus defined in claim 4 wherein the indication of the change in the sensitivity factor $K_2$ has the following functional form:

$$\frac{K_2(t)}{K_2(REF)}$$

where $K_2(REF)$ is a reference probe sensitivity value associated with said calibration target, and $K_2(t)$ is the probe sensitivity during the calibration interval $ct_0$ to $ct_1$.

6. The calibrated ASV measurement apparatus defined in claim 4 further comprising:

(a) sample means to sample said probe voltage output PV during each measurement interval at least at times $t_0$ and $t_1$, and, during each calibration interval, at least at times $ct_0$ and $ct_1$; and (b) an A/D convertor for converting the probe voltage samples from said sample means into a digital representation; and (c) Processing means to operate on the digital representations of probe voltages $PV(t_0)$ and $PV(t_1)$ to provide ASV measurements during each measurement interval, and to operate on the digital representations of probe voltages $PV(ct_0)$ and $PV(ct_1)$ to provide the calibrated probe sensitivity $K_1(t)$ during each calibration interval.

7. The calibrated ASV measurement apparatus defined in claim 6 further including averaging means for providing digital representations of probe voltages $PV(t_0)$ and $PV(t_1)$ and $PV(ct_0)$ and $PV(ct_1)$ based on a corresponding average of a predetermined number of samples.

8. The calibrated ASV measurement apparatus defined in claims 1 and 7 wherein the imaging medium is disposed on the surface of a cylindrical drum, and wherein said GREF potential means comprises:

(a) a narrow, grounded metallic seam disposed lengthwise on the drum surface such that said probe detects the ground reference potential on the seam every revolution of the drum;

(b) and such that, during each measurement interval, the probe voltage $PV(t_0)$ is obtained while the probe is exposed to the grounded seam.

9. A method for measuring the apparent surface voltage (ASV) on an electrostatic/electrophotographic imaging medium (such as the photoconductive surface of an electrophotgraphic drum) using a relatively low cost ASV probe periodically recalibrating probe sensitivity to compensate for variations in environmental and electrical conditions such as temperature, relative humidity, and electrical circuit performance, comprising the steps of:

(a) providing a probe, including a sensing head with a defined sensing field, responsive to ASV on the imaging medium to provide (for a given probe-to-medium spacing) a probe voltage output PV according to the following relation:

$$PV = K_1(t) \cdot ASV + F(t)$$

where probe sensitivity $K_1(t)$ varies with time according to changes in environmental and electrical conditions and $F(t)$ is a voltage which varies with time due to electronic drift and offset effects;

(b) periodically, during a measurement interval, exposing said probe to a reference potential GREF at time $t_0$ such that when said probe is exposed to the ASV on the imaging medium at some later time $t_1$, a differential probe voltage $PV(t_1) - PV(t_0)$ is obtained and ASV can be determined according to the following relation:

$$ASV = \frac{PV(t_1) - PV(t_0)}{K_1(t)} + GREF$$

(c) periodically, during a calibration interval developing an indication of a change in probe sensitivity $K_1(t)$ and correspondingly recalibrating probe sensitivity to compensate for changes in environmental and electrical condition such that accurate ASV measurements can be obtained in accordance with step (b).

10. The calibrated ASV measurement method defined in claim 9 wherein the step of periodically calibrating $K_1(t)$ comprises the steps of:

(a) providing a calibration target, disposed in at least a portion of said probe's sensing field at least during periodic calibration intervals, switchable between two predetermined potentials $CTV_0$ and $CTV_1$;

(b) periodically, during a calibration interval, exposing said probe to said calibration target such that said probe is responsive only to the potentials on said calibration target, and switching said calibration target between the potential $CTV_0$ at time $ct_0$ and $CTV_1$ at time $ct_1$ such that a resulting differential probe voltage $PV(ct_1) - PV(ct_0)$ is related to the potentials on said calibration target according to the following relation:

$$CTV_1 - CTV_0 = \frac{PV(ct_1) - PV(ct_0)}{K_2(t)}$$

where $K_2(t)$ is a sensitivity factor associated with the calibration target which varies over time with changes in environmental and electrical conditions in a corresponding manner to the probe sensitivity $K_1(t)$;

(c) processing the differential value $PV(ct_1) - PV(ct_0)$ to obtain an indication of the change in the sensitivity factor $K_2(t)$ with respect to a reference value; and (d) correspondingly recalibrating probe sensitivity $K_1(t)$ to compensate for variations in environmental and electrical conditions.

11. The calibrated ASV measurement method defined in claim 10 wherein the indication of the change in the sensitivity factor $K_2$ has the following functional form:

$$\frac{K_2(t)}{K_2(REF)}$$

where $K_2(REF)$ is a reference probe sensitivity value associated with said calibration target, and $K_2(t)$ is the probe sensitivity during the calibration interval $ct_0$ to $ct_1$.

12. The calibrated ASV measurement method defined in claim 11 further comprising the steps of:

(a) developing digital representations of the probe voltages $PV(t_0)$ and $PV(t_1)$ and $PV(ct_0)$ and $PV(ct_1)$; and (b) processing digitally the digitized differential voltages $PV(t_1) - PV(t_0)$ and $PV(ct_1) - PV(ct_0)$ together with digital representations of, respectively, probe sensitivity $K_1(t)$ and calibration target sensitivity factor $K_2(t)$ to obtain, during measurement intervals, ASV measurements and, during calibration intervals, recalibrated values for probe sensitivity $K_1(t)$.

13. The calibrated ASV measurement method defined in claim 12 wherein the step of developing digital representations comprises the steps of:

(a) sampling the voltage $PV(t)$ from said probe at least during respective intervals corresponding to times $t_0$ and $t_1$ and $ct_0$ and $ct_1$;

(b) converting the probe voltage samples into digital representations; and (c) averaging the probe voltage samples corresponding to times $t_0$ and $t_1$ and $ct_0$ and $ct_1$ to provide respective digitized probe voltages $PV(t_0)$ and $PV(t_1)$ and $PV(ct_0)$ and $PV(ct_1)$.

14. The calibrated ASV measurement method defined in claims 10 and 12 wherein the step of periodically exposing said probe to a reference voltage GREF comprises the step of periodically interposing a target carrying the reference potential GREF in said probe's sensing field such that said probe is responsive only to the reference voltage GREF.

15. The calibrated ASV measurement method defined in claim 14 wherein the step of periodically exposing the probe to a reference voltage GREF comprises the step of:

(a) providing a grounded metallic seam disposed lengthwise on the cylindical surface of a drum (the remainder of the cylindrical surface comprising the imaging medium) such that said probe detects a ground reference potential every revolution of the drum;

(b) the probe voltgage $PV(t_0)$ being obtained while said probe is exposed to the grounded seam.

* * * * *